United States Patent
Kasai et al.

(10) Patent No.: US 11,776,829 B2
(45) Date of Patent: Oct. 3, 2023

(54) DUMMY WAFER

(71) Applicant: Tokyo Electron Limited, Tokyo (JP)

(72) Inventors: Shigeru Kasai, Yamanashi (JP);
Yutaka Akaike, Yamanashi (JP);
Yoshiyasu Kato, Yamanashi (JP);
Hiroyuki Nakayama, Yamanashi (JP);
Hiroaki Komiya, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 52 days.

(21) Appl. No.: 17/177,687

(22) Filed: Feb. 17, 2021

(65) Prior Publication Data
US 2021/0265183 A1   Aug. 26, 2021

(30) Foreign Application Priority Data
Feb. 20, 2020 (JP) .................. 2020-027481

(51) Int. Cl.
| | |
|---|---|
| *H01L 21/67* | (2006.01) |
| *B32B 7/12* | (2006.01) |
| *B32B 15/01* | (2006.01) |
| *H05B 3/20* | (2006.01) |

(52) U.S. Cl.
CPC .......... *H01L 21/67248* (2013.01); *B32B 7/12* (2013.01); *B32B 15/016* (2013.01); *H05B 3/20* (2013.01); *B32B 2255/06* (2013.01); *B32B 2255/20* (2013.01); *H05B 2203/005* (2013.01)

(58) Field of Classification Search
None
See application file for complete search history.

(56) References Cited

U.S. PATENT DOCUMENTS

| | | | | |
|---|---|---|---|---|
| 5,853,840 | A | * 12/1998 | Saito | ........ H01L 22/34 219/649 |
| 6,150,023 | A | * 11/2000 | Yasaka | ........ H01L 22/34 428/688 |
| 2006/0199135 | A1 | * 9/2006 | Mashima | ........ H05B 3/72 432/214 |
| 2018/0308722 | A1 | 10/2018 | Umeki et al. | |
| 2018/0313697 | A1 | * 11/2018 | Montes | ........ G01K 1/024 |

FOREIGN PATENT DOCUMENTS

| | | |
|---|---|---|
| JP | 2005-123000 A | 5/2005 |
| JP | 2010-519768 A | 6/2010 |
| JP | 2019-071349 A | 5/2019 |
| KR | 1020040070291 A | 8/2004 |
| KR | 10-1718378 B1 | 3/2017 |

* cited by examiner

*Primary Examiner* — Daniel J. Schleis
(74) *Attorney, Agent, or Firm* — Nath, Goldberg & Meyer; Jerald L. Meyer; Tanya E. Harkins

(57) ABSTRACT

A dummy wafer includes a planar heater and a pair of plate-shaped members formed of an aluminum alloy, aluminum, or silicon carbide, wherein the planar heater is sandwiched by the plate-shaped members.

8 Claims, 3 Drawing Sheets

DUMMY WAFER

CROSS-REFERENCE TO RELATED APPLICATION

This application is based upon and claims the benefit of priority from Japanese Patent Application No. 2020-027481, filed on Feb. 20, 2020, the entire contents of which are incorporated herein by reference.

TECHNICAL FIELD

The present disclosure relates to a dummy wafer.

BACKGROUND

Patent Document 1 discloses a technique of a device for measuring parameters. The device includes a substrate, a plurality of sensors carried by and distributed across a surface of the substrate and configured to independently measure parameters at locations thereof, and at least one electronic processing component carried by the surface of the substrate. In addition, the device also includes an electrical conductor extending over the surface of the substrate and connected to the plurality of sensors and the at least one electronic process component, and a cover arranged above the sensors, the electronic process component, and the conductor. The device has substantially the same thickness and/or flatness as a production substrate, and the cover and the substrate have material properties similar to those of the production substrate processed by a substrate processing cell.

PRIOR ART DOCUMENT

[Patent Document]
Patent Document 1: Japanese laid-open publication No. 2010-519768

SUMMARY

An aspect of the present disclosure provides a dummy wafer that includes a planar heater and a pair of plate-shaped members formed of an aluminum alloy, aluminum, or silicon carbide, wherein the planar heater is sandwiched by the plate-shaped members.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
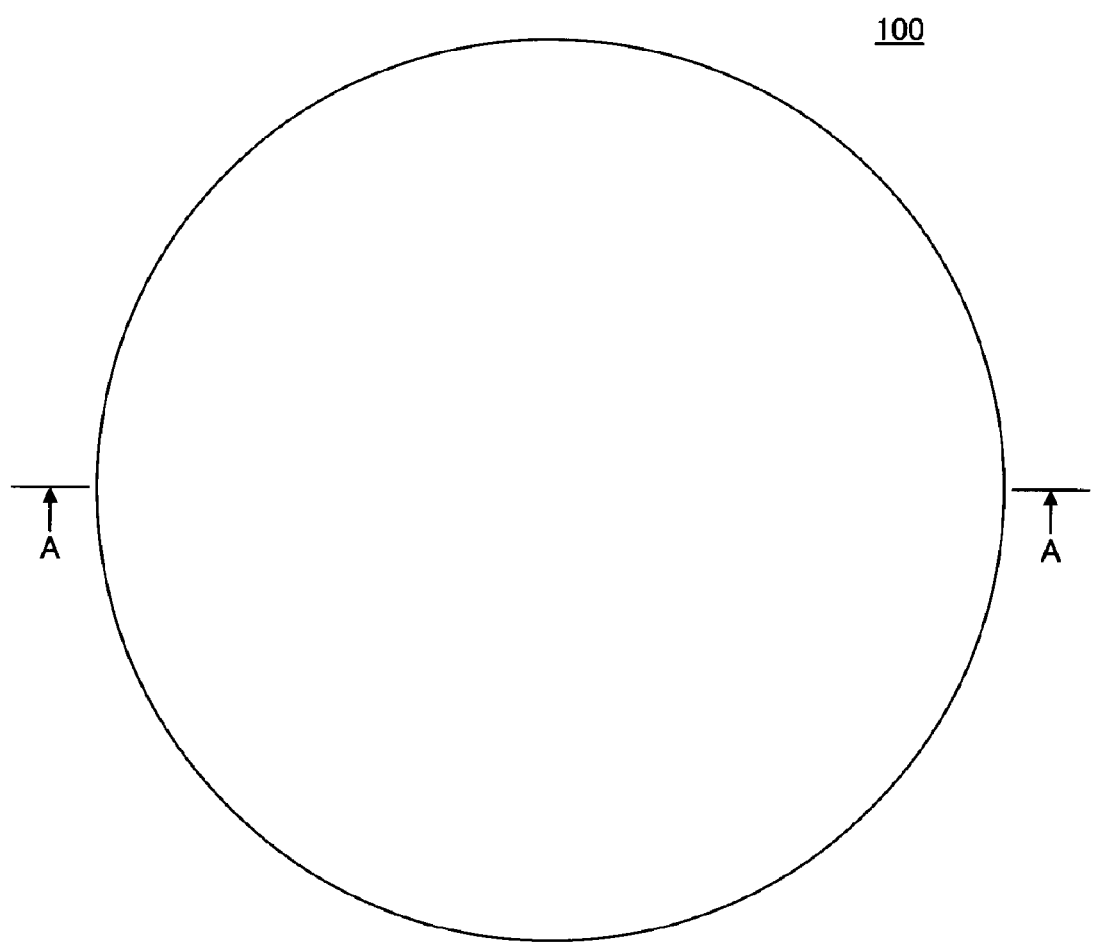
FIG. 1 is a view illustrating an exemplary dummy wafer according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, exemplary embodiments for carrying out the present disclosure will be described with reference to drawings. In the specification and drawings, components that are substantially the same will be denoted by the same reference numerals, and redundant descriptions may be omitted. The following description will be made with reference to a vertical direction or vertical relationship in the drawings, but it does not represent a universal vertical direction or vertical relationship.

Figure 2:
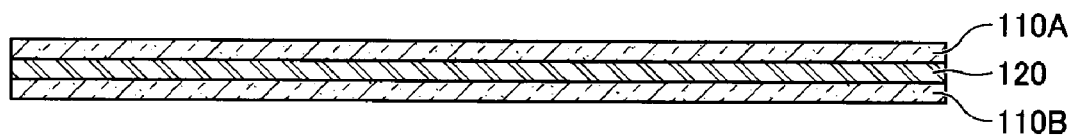
FIG. 2 is a view illustrating an exemplary cross section taken along line A-A in FIG. 1.
Figure 3:
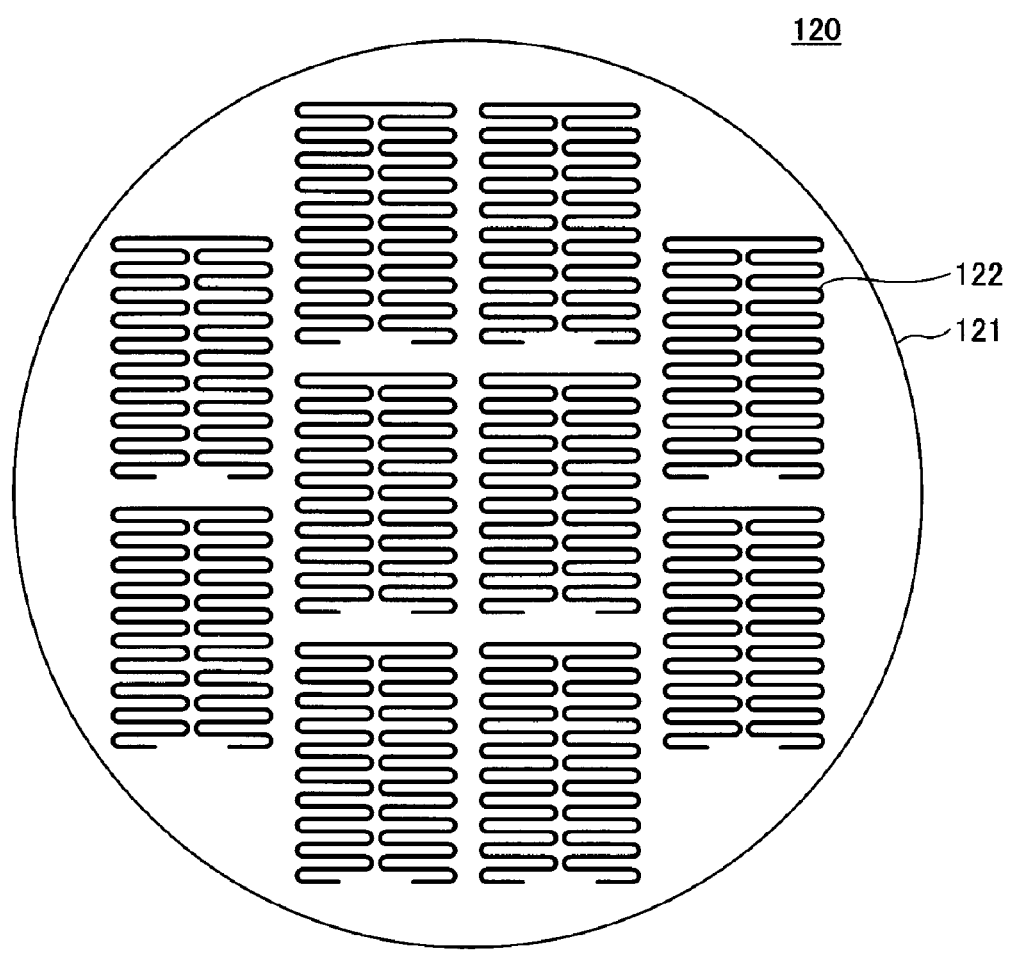
FIG. 3 is a view illustrating an exemplary planar heater.

FIG. 1 is a view illustrating an exemplary dummy wafer 100 according to an embodiment. FIG. 2 is a view illustrating an exemplary cross section taken along line A-A in FIG. 1. The dummy wafer 100 includes plates 110A and 110B and a planar heater 120. FIG. 3 is a view illustrating an example of the planar heater 120.

The dummy wafer 100 is used, for example, when measuring a temperature distribution of the dummy wafer 100 or a temperature distribution of the dummy wafer 100 and a chuck top of an inspection apparatus, which inspects electrical characteristics of electronic devices formed on a silicon wafer, by placing the dummy wafer 100 on the chuck in place of the silicon wafer. Image data showing the temperature distribution is captured by using an infrared thermography camera.

Since the planar heater 120 includes a plurality of independently controllable heating elements 122, it is possible to simulate a state in which an electrical signal is supplied from a probe pin to any of a plurality of electronic devices formed on a silicon wafer to generate heat by selectively heating some of the plurality of heating elements 122 when measuring a temperature distribution. That is, the dummy wafer 100 is a device capable of simulating a state of inspecting electrical characteristics of actual electronic devices under the same heat generation condition as when inspecting electrical characteristics of electronic devices formed on an actual silicon wafer.

As an example, the dummy wafer 100 has a disk shape like a silicon wafer and has a diameter equal to that of the silicon wafer. The diameter of the dummy wafer 100 is, for example, 150 mm (6 inches), 200 mm (8 inches), or 300 mm (12 inches). The dummy wafer 100 may have a reference surface, a notch, or the like which indicates a crystalline orientation. A thickness of the dummy wafer 100 is, for example, about 0.5 mm to 1 mm, and is approximately the same thickness as the silicon wafer.

The plates 110A and 110B are a pair of exemplary plate-shaped members, and are respectively fixed to opposite sides of the planar heater 120. In other words, the planar heater 120 is sandwiched by the plates 110A and 110B. The plates 110A and 110B are formed of, for example, an A5052 series aluminum alloy, and have an oxide film formed on surfaces thereof through an alumite treatment (anodizing treatment). Thicknesses of the plates 110A and 110B are, for example, about 0.1 mm to about 0.3 mm.

The plates 110A and 110B formed of an A5052 series aluminum alloy do not transmit infrared rays emitted by the heating elements 122. A wavelength of the infrared rays emitted by the heating elements 122 is, for example, about 1 µm to 20 µm. Accordingly, when the dummy wafer 100 is imaged by using an infrared thermography camera, a temperature distribution of the plate 110A located on the upper side is obtained.

Here, when making a dummy of a silicon wafer, it is conceivable to use, for example, a silicon plate thinner than the silicon wafer as the plates 110A and 110B. However, since silicon has a property of transmitting infrared rays of about 1.2 μm or more, when an image is captured by using an infrared thermography camera, a pattern (shape) of the heating elements 122 of the planar heater 120 under the plate 110A is included in an infrared image. Since the heating elements 122 have a higher temperature than the plate 110A, the infrared image substantially represents the pattern (shape) of the heating elements 122 only. Thus, it is impossible to accurately recognize a temperature distribution generated on the upper plate 110A based on the infrared image. For this reason, in order to fabricate the plates 110A and 110B by using a material having a property of not transmitting infrared rays, an A5052 series aluminum alloy, for example, is used.

The A5052 series is an aluminum alloy having the JIS aluminum alloy number of A5052, and means that tempering of a material, which indicates a type of heat treatment or the like, can be any one. The A5052 series aluminum alloy is an alloy of aluminum and magnesium, and the material properties thereof, such as a specific heat, a density, a volume specific heat, a relative volume specific heat, a thermal expansion coefficient, and a thermal conductivity, are close to those of silicon. Thus, the A5052 series aluminum alloy is suitable as a material for the plates 110A and 110B.

The reason that the two plates 110A and 110B are used is that, by sandwiching the planar heater 120 by the plates 110A and 110B, thermal expansion can be generated evenly on an upper surface side (here, a side of the plate 110A) of the dummy wafer 100 and a lower surface side (here, a side of the plate 110B) of the dummy wafer 100, so that the upper surface side and the lower surface side are balanced.

In addition, an alumite treatment is performed on the surfaces of the plates 110A and 110B in order to protect the surfaces of the plates 110A and 110B and to bond the plates 110A and 110B to the opposite sides of the planar heater 120 through an anchor effect. Since an oxide film formed through the alumite treatment is a porous layer having fine pores, a polyimide film of the planar heater 120 is adsorbed due to the anchor effect. As described above, the plates 110A and 110B and the planar heater 120 are bonded to one another without using, for example, an adhesive.

By bonding the plates 110A and 110B to the planar heater 120, it is possible to implement the dummy wafer 100 having a heat capacity equivalent to (very close to) that of a silicon wafer. By using the dummy wafer 100 having the same heat capacity as a silicon wafer, it is possible to obtain a temperature distribution very close to that of the silicon wafer, and to simulate the temperature distribution of the silicon wafer.

In some embodiments, the oxide film formed through the alumite treatment may be black, and more specifically, may be matte black. This is because the dummy wafer 100 itself has the most difficult color to capture when the infrared image showing the temperature distribution of the dummy wafer 100 is captured by using an infrared thermography camera. In addition to black, the oxide film may have a color having a low brightness to a certain extent.

Here, a case in which the plates 110A and 110B are formed of an A5052 series aluminum alloy will be described, but the aluminum alloy may be an aluminum alloy of the JIS aluminum alloy number A6061 series.

The A6061 series is an aluminum alloy having the JIS aluminum alloy number of A6061, and means that tempering of a material, which indicates a type of heat treatment or the like, can be any one. As an example, among the A6061 series aluminum alloys, the A6061T4 aluminum alloy, the tempering of which is T4, may be used. The A6061 series aluminum alloy does not transmit infrared rays, like the A5052 series aluminum alloy. The A6061 series aluminum alloy is an alloy of aluminum, magnesium, and silicon, and the material properties thereof, such as a specific heat, a density, a volume specific heat, a relative volume specific heat, a thermal expansion coefficient, and a thermal conductivity, are close to those of silicon, like the A5052 series aluminum alloy. Thus, the A6061 series aluminum alloy is suitable as a material for the plates 110A and 110B.

In addition, the surfaces of the plates 110A and 110B may be subjected to a blasting treatment such as a sandblasting treatment, instead of the alumite treatment. The surfaces may be made uneven through the sandblasting treatment to bond the plates 110A and 110B to the planar heater 120 through an anchor effect. In addition, the plates 110A and 110B may be subjected to the alumite treatment to form an oxide film, and then subjected to the sandblasting treatment. The blasting treatment may be performed at least on the surfaces of the plates 110A and 110B that are to be bonded to the planar heater 120.

In addition, the plates 110A and 110B may be formed of an A5052 series or an A6061 series aluminum alloy which has not been subjected to an alumite treatment. When the alumite treatment has not been performed, the plates 110A and 110B may be bonded to the opposite surfaces of the planar heater 120 by using an adhesive or the like, as long as the heat capacity of the dummy wafer 100 dose not significantly differ from that of a silicon wafer even if, for example, the adhesive is used. This is because when the heat capacity of the dummy wafer 100 significantly differs from that of the silicon wafer, the simulated temperature distribution will significantly differ from a temperature distribution of an actual silicon wafer.

In addition, the plates 110A and 110B may be formed of aluminum (Al) or silicon carbide (SiC) since it is sufficient that the plates 110A and 110B are formed of a material having material properties, such as a specific heat, a density, a volume specific heat, a relative volume specific heat, a thermal expansion coefficient, and a thermal conductivity, which are close to those of silicon.

In the case of aluminum, when an oxide film is formed on the surfaces through an alumite treatment, the plates 110A and 110B and the planar heater 120 may be bonded to one another without using, for example, an adhesive. In addition, when the alumite treatment is performed, it may make it difficult to capture an image of the dummy wafer 100 when the image is captured by using an infrared thermography camera. In addition, the plates 110A and 110B may be bonded to the opposite sides of the planar heater 120 by using an adhesive or the like without performing the alumite treatment, as long as the heat capacity of the dummy wafer 100 does not significantly differ from that of a silicon wafer and a temperature distribution simulating a temperature distribution of a real silicon wafer can be obtained, even though the alumite treatment is not performed and the adhesive is used.

In the case of silicon carbonate, the surfaces may be made uneven through a blasting treatment, such as a sandblasting treatment, to bond the plates 110A and 110B to the planar heater 120 through an anchor effect. The blasting treatment may be performed at least on the surfaces of the plates 110A and 110B that are to be bonded to the planar heater 120. Silicon carbide has a relative volume specific heat of 1.2, which is close to that of silicon, and is therefore very suitable as a material for the plates 110A and 110B. In addition, the plates 110A and 110B may be bonded to the opposite sides of the planar heater 120 by using an adhesive or the like without performing the sandblasting treatment, as long as the heat capacity of the dummy wafer 100 does not significantly differ from that of a silicon wafer and a temperature distribution simulating a temperature distribution of a real silicon wafer can be obtained even though the sandblasting treatment is not performed and the adhesive is used.

The planar heater 120 is a sheet-shaped heater having a very thin thickness, and has a film 121 and the plurality of heating elements 122, as illustrated in FIG. 3. The thickness of the planar heater 120 is, for example, about 0.1 mm to about 0.3 mm. The planar heater 120 is provided between the plates 110A and 110B, as illustrated in FIG. 2. A thickness of the dummy wafer 100 in which the planar heater 120 provided between the plates 110A and 110B is equivalent to a thickness of a silicon wafer, and is, for example, 0.5 mm to 1 mm.

The film 121 is formed of, for example, polyimide, and serves as a film substrate on which the heating elements 122 are formed. The heating elements 122 are heaters formed of, for example, a stainless metal foil, and serve as heating wires. Since stainless steel easily forms a fine pattern, stainless steel is suitable for forming the plurality of heating elements 122 on the film 121.

The film 121 is composed of, for example, two sheets of polyimide films. The planar heater 120 has a configuration in which the plurality of heating elements 122 is sandwiched by the two polyimide films by patterning a stainless metal foil formed on one surface of one polyimide film into the shape of the plurality of heating elements 122 through an etching process and then bonding the other polyimide film to the one polyimide film through a thermocompression bonding process. Thus, the heating elements 122 are insulated.

FIG. 3 illustrates, for example, ten heating elements 122, each of which is enlarged such that the pattern thereof can be seen. As an example, the number of the heating elements 122 is set to be the same as the number of electronic devices (dies) fabricated on an actual silicon wafer, and the heating elements 122 have the same planar dimension as the dies. In FIG. 3, terminals connected to the patterns of respective heating elements 122 are omitted, but a positive electrode terminal and a negative electrode terminal for supplying an electric current are connected to each heating element 122. As an example, the positive electrode terminal and the negative electrode terminal of each heating element 122 may extend to the outer periphery of the film 121 while avoiding other heating elements 122.

The stainless metal foil formed on one surface of one polyimide film may be patterned to obtain the plurality of heating elements 122. For example, when an actual silicon wafer contains 150 square electronic devices, each of which has a one side length of 1 cm, the planar heater 120 may have a configuration including 150 square heating elements 122, each of which has a one side length of 1 cm.

One or more arbitrary heating elements 122 can selectively generate heat by connecting the positive and negative terminals of each heating element 122 to a power supply (not illustrated) to independently flow an electric current to each heating element 122. As a result, it is possible to simulate a state in which a plurality of electronic devices formed on a silicon wafer generates heat. In addition, a plurality of combinations of selected one or more heating elements 122 may be prepared.

When the dummy wafer 100 is imaged by using an infrared thermography camera in a state in which one or more arbitrary heating elements 122 are selected and generate heat, it is possible to measure the temperature distribution of the dummy wafer 100 or to measure the temperature distribution of the dummy wafer 100 and the chuck top. The upper limit of the temperature of the dummy wafer 100 due to the heat generated by the heating elements 122 is, for example, 200 degrees C. This is because the upper limit of the temperature of the polyimide film used as the film 121 is about 200 degrees C.

As described above, since the plates 110A and 110B of the dummy wafer 100 are formed of an A5052 series aluminum alloy, the plates 110A and 110B do not transmit the infrared rays emitted by the heating elements 122. Therefore, when the dummy wafer 100 is imaged by using an infrared thermography camera, it is possible to obtain an infrared image showing the temperature distribution of the plate 110A located on the upper side. The temperature distribution of the plate 110A is obtained by heating one or more arbitrary heating elements 122 included in the planar heater 120, and simulates heat generation by electronic devices formed on a silicon wafer.

Further, since the A5052 series aluminum alloy used as the plates 110A and 110B has material properties, such as a specific heat, a density, a volume specific heat, a relative volume specific heat, a thermal expansion coefficient, and a thermal conductivity, which are close to those of silicon, it is possible to obtain a temperature distribution similar to that obtained when electronic devices formed on a silicon wafer are heated. Therefore, it is possible to obtain an infrared image showing a simulated temperature distribution in a state close to the state of inspecting the electrical characteristics of electronic devices formed on an actual silicon wafer.

Therefore, it is possible to provide the dummy wafer 100 capable of acquiring an infrared image showing a temperature distribution that simulates a temperature distribution caused by heat generation of electronic devices formed on a silicon wafer.

Since the dummy wafer 100 has a configuration in which the plates 110A and 110B formed of an A5052 series aluminum alloy, on which an alumite treatment has been performed, and the planar heater 120 are bonded to one another without using an adhesive, the dummy wafer 100 can be made extremely thin and has a thickness of 0.5 mm to 1 mm, which is equivalent to the thickness of a silicon wafer. As described above, by bonding the plates 110A and 110B and the planar heater 120 to one another without using an adhesive, the heat capacity of the dummy wafer 100 can be made to be equivalent to the heat capacity of a silicon wafer. Therefore, it is also possible to provide the dummy wafer 100 capable of acquiring an infrared image showing a temperature distribution that simulates a temperature distribution caused by heat generation of electronic devices formed on a silicon wafer.

In addition, the heat capacity of the dummy wafer 100 is also made to be equivalent to the heat capacity of a silicon wafer when an alumite-treated A6061 series aluminum alloy, alumite-treated aluminum, and sandblasted silicon carbide are used for the plates 110A and 110B. In these cases, it is also possible to provide the dummy wafer 100 capable of acquiring an infrared image showing a temperature distribution that simulates a temperature distribution caused by heat generation of electronic devices formed on a silicon wafer.

In addition, when a heat capacity close to that of a silicon wafer is obtained even if the plates 110A and 110B and the planar heater 120 are bonded to one another by using, for example, an adhesive without performing an alumite treatment on an A5052 series aluminum alloy, an A6061 series aluminum alloy, and aluminum, it is possible to provide the dummy wafer 100 capable of acquiring an infrared image showing a simulated temperature distribution.

In recent years, due to the trend toward higher functionality and higher integration, there is a demand to evaluate a temperature distribution including heat generation of electronic devices formed on a wafer placed on a chuck top. In response to such a demand, in order to realize the same conditions as those during an actual test, it is conceivable to actually form electronic devices on a silicon wafer and to acquire a temperature distribution while performing an operation test of the electronic devices. However, actually forming electronic devices on a silicon wafer requires a huge investment of time and expenses to realize a semiconductor process, and thus it is not practical to realize the same.

In contrast, the dummy wafer 100 can be implemented to have a configuration in which a heat capacity thereof is equivalent to that of a silicon wafer by providing the planar heater 120 between the plates 110A and 110B formed of, for example, an aluminum alloy. Therefore, by using the dummy wafer 100, it is possible to simulate a state in which electrical characteristics of electronic devices formed on a silicon wafer are inspected in a short time and at low cost without spending a huge investment of time and expenses required for realizing a semiconductor process. It is possible to evaluate a temperature distribution in a short time and at low cost by using an infrared image showing a temperature distribution that simulates a temperature distribution caused by heat generation of the electronic devices formed on the silicon wafer.

Although the embodiments of the dummy wafer according to the present disclosure have been described above, the present disclosure is not limited to the above-described embodiments. Various changes, modifications, substitutions, additions, deletions, and combinations can be made within the scope of the claims. Of course, these also fall within the technical scope of the present disclosure.

According to the present disclosure, it is possible to acquire an infrared image showing a temperature distribution simulating a temperature distribution caused by heat generation of electronic devices formed on a silicon wafer.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A dummy wafer comprising:
a planar heater; and
a pair of plate-shaped members formed of an aluminum alloy or aluminum,
wherein the planar heater is sandwiched by the plate-shaped members, and
wherein the aluminum alloy is an A5052 series or A6061 series aluminum alloy,
wherein an oxide film, which is formed through an alumite treatment, is formed on a surface of each of the plate-shaped members.

2. The dummy wafer of claim 1, wherein the oxide film is black.

3. The dummy wafer of claim 1, wherein the oxide film is matte black.

4. The dummy wafer of claim 1, wherein at least surfaces of the pair of plate-shaped members, which are in contact with the planar heater, are surfaces on which a blasting treatment has been performed.

5. A dummy wafer comprising:
a planar heater; and
a pair of plate-shaped members formed of an aluminum alloy or aluminum,
wherein the planar heater is sandwiched by the plate-shaped members, and
wherein an oxide film, which is formed through an alumite treatment, is formed on a surface of each of the plate-shaped members.

6. The dummy wafer of claim 5, wherein the oxide film is black.

7. The dummy wafer of claim 5, wherein the oxide film is matte black.

8. The dummy wafer of claim 5, wherein at least surfaces of the pair of plate-shaped members, which are in contact with the planar heater, are surfaces on which a blasting treatment has been performed.

* * * * *